(12) United States Patent
Guo et al.

(10) Patent No.: US 10,056,378 B2
(45) Date of Patent: Aug. 21, 2018

(54) SILICON NITRIDE FILL FOR PC GAP REGIONS TO INCREASE CELL DENSITY

(71) Applicant: International Business Machines Corporation, Armonk, NY (US)

(72) Inventors: Dechao Guo, Niskayuna, NY (US); Zuoguang Liu, Schenectady, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/805,420

(22) Filed: Nov. 7, 2017

(65) Prior Publication Data

US 2018/0069002 A1 Mar. 8, 2018

Related U.S. Application Data

(63) Continuation of application No. 14/605,142, filed on Jan. 26, 2015, now Pat. No. 9,859,275.

(51) Int. Cl.
*H01L 21/338* (2006.01)
*H01L 27/088* (2006.01)
*H01L 29/49* (2006.01)
*H01L 21/762* (2006.01)
*H01L 21/8234* (2006.01)
*H01L 29/06* (2006.01)
*H01L 21/3213* (2006.01)
*H01L 21/02* (2006.01)
(Continued)

(52) U.S. Cl.
CPC .... *H01L 27/0886* (2013.01); *H01L 21/76224* (2013.01); *H01L 21/823431* (2013.01); *H01L 21/823481* (2013.01); *H01L 29/0653* (2013.01); *H01L 29/4916* (2013.01); *H01L 21/02134* (2013.01); *H01L 21/32139* (2013.01); *H01L 27/0207* (2013.01); *H01L 27/1211* (2013.01)

(58) Field of Classification Search
CPC ........ H01L 27/0866; H01L 21/823431; H01L 21/823481; H01L 21/76224; H01L 29/4916; H01L 27/1211; H01L 27/0207; H01L 21/02134
USPC .............. 438/184, 176, 195, 197, 207, 196; 257/365, 369, 390
See application file for complete search history.

(56) References Cited

U.S. PATENT DOCUMENTS

| | | |
|---|---|---|
| 6,787,402 B1 | 9/2004 | Yu |
| 7,352,034 B2 | 4/2008 | Booth, Jr. et al. |
| 7,402,856 B2 | 7/2008 | Brask et al. |

(Continued)

OTHER PUBLICATIONS

Guo et al., "Silicon Nitride Fill for PC Gap Regions to Increase Cell Density", U.S. Appl. No. 14/605,142, filed Jan. 26, 2015, 31 pages.
(Continued)

*Primary Examiner* — Thinh T Nguyen
(74) *Attorney, Agent, or Firm* — Edward J. Wixted, III

(57) ABSTRACT

A semiconductor device is provided comprising a substrate, two or more semiconductor fins, and one or more gates. A flowable oxide layer is deposited on the semiconductor device. An area between the two or more semiconductor fins is etched such that the substrate is exposed. An insulating layer is deposited within the etched area. At least the flowable oxide layer is removed.

13 Claims, 11 Drawing Sheets

(51) Int. Cl.
   *H01L 27/02*   (2006.01)
   *H01L 27/12*   (2006.01)

(56) References Cited

U.S. PATENT DOCUMENTS

| | | |
|---|---|---|
| 7,470,570 B2 | 12/2008 | Beintner et al. |
| 7,795,664 B2 | 9/2010 | Aritome |
| 8,076,190 B2 | 12/2011 | Chen et al. |
| 8,293,616 B2 | 10/2012 | Chang et al. |
| 8,441,072 B2 | 5/2013 | Tsai et al. |
| 8,455,330 B2 | 6/2013 | Anderson et al. |
| 8,470,714 B1 | 6/2013 | Tsai et al. |
| 8,674,413 B1 | 3/2014 | Chi |
| 9,041,115 B2 | 5/2015 | Liaw |
| 2011/0068400 A1 | 3/2011 | Wang et al. |
| 2013/0119370 A1 | 5/2013 | Wu et al. |
| 2013/0140639 A1* | 6/2013 | Shieh .............. H01L 21/823412 257/368 |
| 2013/0244387 A1 | 9/2013 | Cho |
| 2013/0277758 A1 | 10/2013 | Chang et al. |
| 2013/0292777 A1* | 11/2013 | Liaw .................... G11C 11/412 257/369 |
| 2013/0307079 A1 | 11/2013 | Jagannathan et al. |

OTHER PUBLICATIONS

IBM List of Patent Applications Treated as Related, "Appendix P", Dated Nov. 7, 2017, 2 pages.

\* cited by examiner

SILICON NITRIDE FILL FOR PC GAP REGIONS TO INCREASE CELL DENSITY

BACKGROUND OF THE INVENTION

The present invention relates generally to the field of transistors, and more particularly to increasing the density of finFET devices on a substrate.

With the increasing down scaling of integrated circuits and increasingly higher requirements for integrated circuits, transistors need to have higher drive currents with increasingly smaller dimensions. In its basic form, a finFET device includes a source, a drain, and one or more fin-shaped channels between the source and the drain. A gate electrode over the fin(s) regulates electron flow between the source and the drain. In general, finFET devices facilitate manufacturing smaller and smaller transistors. As devices must be formed closer together, it becomes more difficult to electrically isolate adjacent electronic devices and prevent short circuits from forming.

SUMMARY

Embodiments of the invention disclose a method of fabricating localized isolation between a first gate terminal and a second gate terminal and the resulting semiconductor device. A semiconductor device is provided including a substrate, two or more semiconductor fins, and one or more gates. A flowable oxide layer is deposited on the semiconductor device. An area between the two or more semiconductor fins is etched such that the substrate is exposed. An insulating layer is deposited within the etched area. At least the flowable oxide layer is removed.

A semiconductor device is provided including a substrate and two or more semiconductor fins formed on the substrate. A flowable oxide layer is deposited on the semiconductor device. An area between the two or more semiconductor fins is etched such that the substrate is exposed. An insulating layer is deposited within the etched area. At least the flowable oxide layer is removed. A first gate is formed over at least a first semiconductor fin of the two or more semiconductor fins. A second gate is formed over at least a second semiconductor fin of the two or more semiconductor fins.

The resulting semiconductor device comprises a substrate, a first set and second set of one or more semiconductor fins formed on the substrate, a first gate formed on the first set of one or more semiconductor fins and a second gate formed on the second set of one or more semiconductor fins, and an insulating layer formed on the substrate in an area between the first gate and the second gate.

DETAILED DESCRIPTION

Figure 1A:
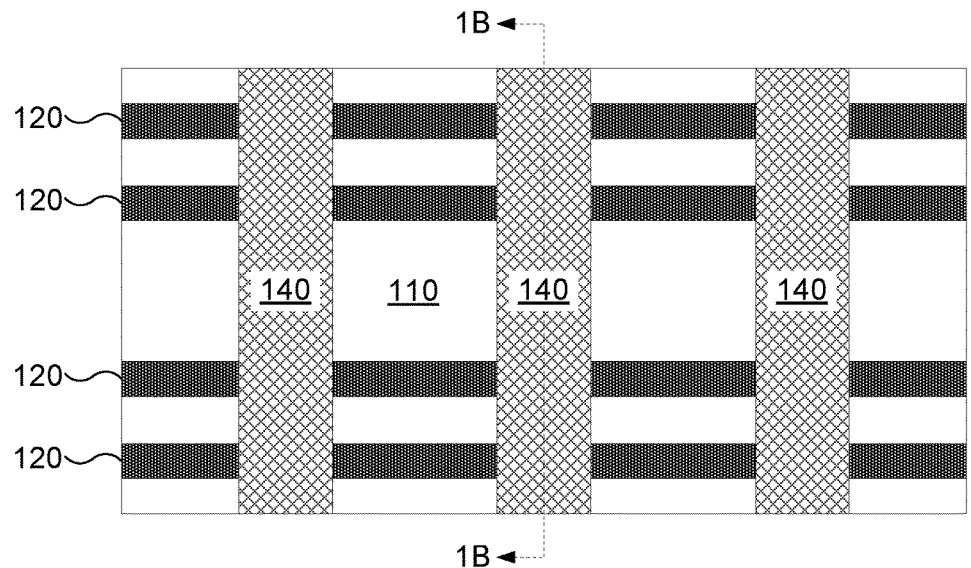
FIG. 1A depicts a top view of a buried oxide layer, fin, PC layer, and hard mask layer forming a finFET device on which the invention may be implemented, in accordance with a first embodiment of the invention.

Embodiments of the present invention generally provide a finFET device with reduced parasitic capacitance and parasitic resistance. A detailed description of embodiments of the claimed structures and methods are included herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present invention will now be described in detail with reference to the Figures. FIGS. 1A-5B depict the formation of a polysilicon (PC) gap insulator, in accordance with first depicted embodiment of the invention. FIGS. 6A-11B depict the formation of a PC gap insulator, in accordance with a second depicted embodiment of the invention. In general, the first depicted embodiment of the invention illustrates an embodiment where a PC gap insulator is formed after the PC lines of the current finFET device are formed, while the second depicted embodiment of the invention illustrates an embodiment where a PC gap insulator is formed before the PC lines are formed.

Figure 1B:
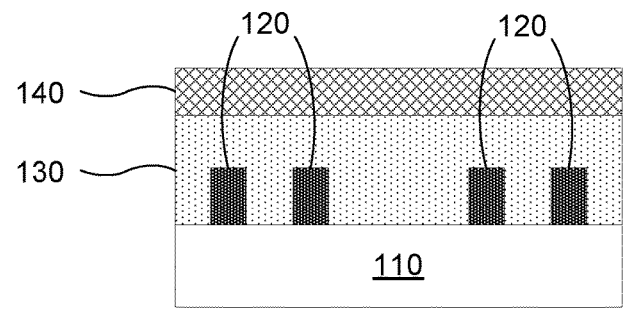
FIG. 1B depicts a section view of a buried oxide layer, fin, PC layer, and hard mask layer forming a finFET device on which the invention may be implemented, in accordance with the first embodiment of the invention.

FIGS. 1A and 1B illustrate a top view and a section view of a finFET transistor on which embodiments of the present invention may be implemented, in accordance with the first depicted embodiment of the invention. The finFET transistor depicted in FIGS. 1A and 1B includes buried oxide layer 110, fin 120, PC Layer 130, and hard mask layer 140. In general, buried oxide layer 110 acts as an electrical insulator on which the current finFET device is constructed. While the depicted embodiment includes an illustration of silicon on insulator (SOI) construction, it should be appreciated by one skilled in the art that the invention is not limited to SOI construction and that other types of semiconductor construction can be used in various embodiments of the invention, for example, bulk silicon construction. In embodiments where bulk silicon construction is used, buried oxide layer 110 may not be present in the starting wafer on which the current finFET device is constructed, and a semiconductor substrate or a shallow trench isolation (STI) filled semiconductor substrate may be present in its place. Fin 120 acts as the channel layer of the current finFET device, in accordance with various embodiments of the invention. Although the depicted embodiment includes four fins or channels present on buried oxide layer 110, any number of fins may be present in various embodiments of the invention.

In some embodiments, such as the depicted embodiment, the current finFET device being created is an n-type finFET device including a p-type fin and n-type contacts for source and drain. In such embodiments, fin 120 is composed of silicon doped with p-type dopants such as boron. Fin 120 is deposited using, for example, low pressure chemical vapor deposition (LPCVD). In other embodiments, the current finFET device is a p-type FET including an n-type fin and p-type contacts for source and drain. In such embodiments, fin 120 is composed of silicon doped with n-type dopants such as phosphorus. Various embodiments of the invention can include multiple n-type finFET devices and multiple p-type finFET devices operating in conjunction to perform a specific function. Other materials of which fin 120 may be formed include, but are not limited to, germanium or silicon-germanium alloys. In a preferred embodiment, fin 120 is between 5 nm and 50 nm thick and is preferably about 20 nm thick. In various embodiments, the outermost surface of fin 120 is covered with a thin oxide layer composed of, for example, silicon dioxide ($SiO_2$) between 1 and 2 nm thick to prevent direct conductivity between fin 120 and the gate terminal of the finFET device.

In various embodiments, PC layer 130 acts as a dummy gate terminal of the present finFET device. In general, PC layer 130 serves as a temporary placeholder for the gate terminal of the finFET device, and the material of which PC layer 130 is formed is later replaced with a gate dielectric stack such as hafnium oxide ($HfO_2$) and a metal gate stack such as aluminum, tungsten, or titanium in the proceeding fabrication steps not depicted in this embodiment. In the depicted embodiment, three PC lines (PC layer 130) are present in the depicted finFET device. However, in other embodiments, any number of PC lines may be present. In some embodiments, it is desirable to control an entire PC line using a single applied voltage source. In other embodiments, it is desirable to control discrete portions of a given PC line independently. In the depicted embodiment, one is able to control the top portion and bottom portion of the middle PC line independently. The top portion of the middle PC line is defined as the portion passing over the two top-most fins in the depicted embodiment, while the bottom portion of the middle PC line is defined as the portion passing over the two bottom-most fins. In order to control the top portion and bottom portion of the middle PC line independently, a portion of the middle PC line dividing the top and bottom portions of the middle PC line is removed and replaced with an insulative material which prevents conduction between the top and bottom portions of the middle PC line.

In the depicted embodiment, hard mask layer 140 is present above PC layer 130. Hard mask layer 140 is a layer used to define the desired shape of PC layer 130 during the formation of PC layer 130 and to protect PC layer 130 during subsequent fabrication steps. In various embodiments, hard mask layer 140 is composed of, for example, a dielectric material such as silicon nitride (SiN), silicon dioxide ($SiO_2$), or a combination of SiN and $SiO_2$.

Figure 2A:
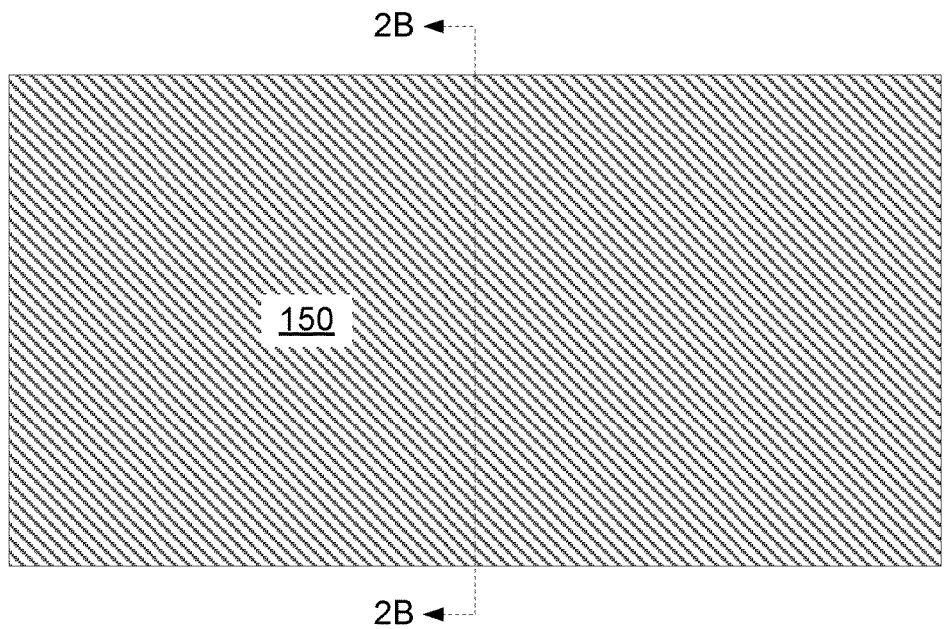
FIG. 2A depicts a top view of deposition and planarization of a flowable oxide layer deposited on the finFET device of FIG. 1A, in accordance with the first embodiment of the invention.
Figure 2B:
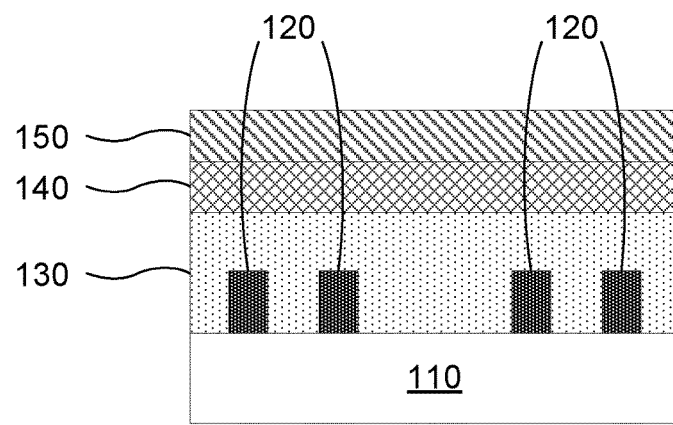
FIG. 2B depicts a section view of deposition and planarization of a flowable oxide layer deposited on the finFET device of FIG. 1A, in accordance with the first embodiment of the invention.

FIGS. 2A and 2B depict a top and section view of deposition and planarization of flowable oxide layer 150, in accordance with the first depicted embodiment of the invention. Flowable oxide layer 150 is used to isolate the PC gap region which is to be filled with a PC gap insulator so that other sections of the device are not harmed in the formation of the PC gap insulator. In various embodiments, flowable oxide layer 150 is composed of silicon dioxide ($SiO_2$), deposited using, for example, low pressure chemical vapor deposition (LPCVD). In general, flowable oxide layer 150 extends upwards from the top surface of buried oxide layer 110 to above the top of hard mask layer 140. In various embodiments, the depicted form of flowable oxide layer 150 is created by depositing flowable oxide layer 150 above the desired height then utilizing a planarization process such as chemical mechanical planarization (CMP) to reduce the height of flowable oxide layer 150 to the desired height. This method of forming flowable oxide layer 150 is advantageous because it allows for the correct height of flowable oxide layer 150 to be formed evenly when the topology on which flowable oxide layer 150 is deposited is irregular such as the topology on which flowable oxide layer is deposited as depicted in FIGS. 1A and 1B.

Figure 3A:
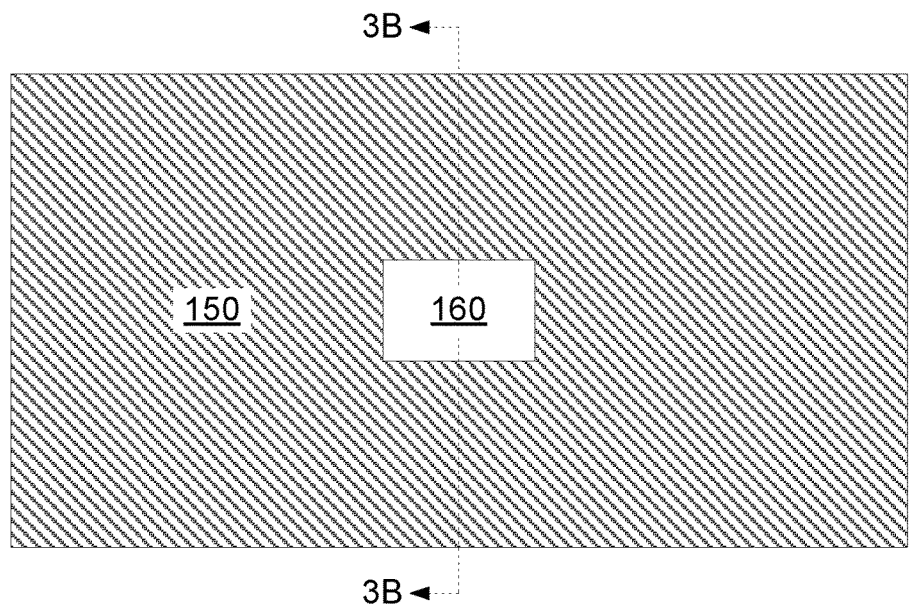
FIG. 3A depicts a top view of etching a portion of the flowable oxide layer of FIG. 2A and the PC layer and hard mask layer of FIG. 1A to form a PC gap region, in accordance with the first embodiment of the invention.
Figure 3B:
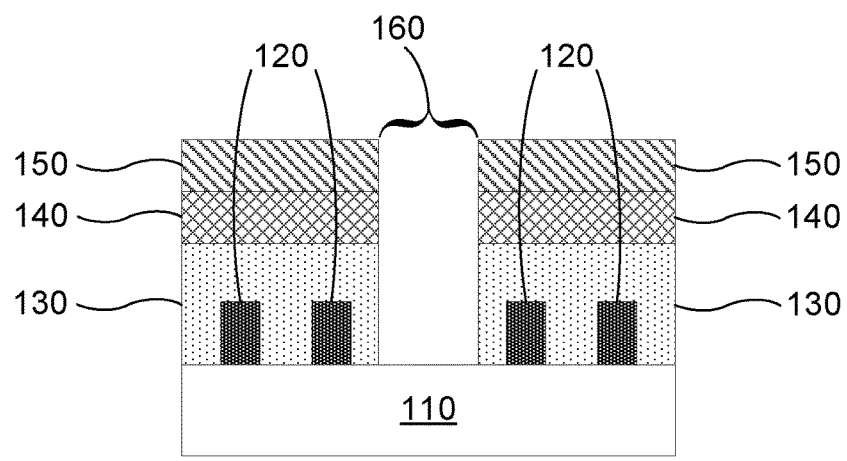
FIG. 3B depicts a section view of etching a portion of the flowable oxide layer of FIG. 2A and the PC layer and hard mask layer of FIG. 1A to form a PC gap region, in accordance with the first embodiment of the invention.

FIGS. 3A and 3B depict a top and section view of formation of PC gap region 160, in accordance with the first depicted embodiment of the invention. PC gap region 160 is the region of PC layer 130 which is removed to allow the top and bottom portions of the middle PC line to function as two independent gate terminals of the current finFET device. The process of patterning the areas of PC layer 130, hard mask layer 140, and flowable oxide layer 150 to be removed in the formation of PC gap region 160 involves the use of standard photolithographic processes to define the desired shape of PC gap region 160 in a layer of photoresist (not shown) deposited on the top surface of flowable oxide layer 150. In various embodiments, standard photolithographic processes are used to remove a portion of the photoresist layer corresponding to the area of PC layer 130, hard mask layer 140, and flowable oxide layer 150 which are to be removed in the formation of PC gap region 160. It will be appreciated by one skilled in the art that a separate process may be required to remove each of the layers which must be removed to form PC gap region 160 in some embodiments of the invention. In some of these embodiments, the layer of photoresist is used to define the portions of each of the underlying layers which are to be removed, while in some of these embodiments, the layer of photoresist is replaced before each etch process begins. In the depicted embodiment, the portion of flowable oxide layer 150 which is to be removed is removed using, for example, a hydrogen fluoride (HF) dip or a dry etch process such as reactive ion etching (RIE) to remove the desired portion of flowable oxide layer 150. Additionally, the portion of hard mask layer 140 present below the removed portion of flowable oxide layer 150 can be removed using, for example, a dry etch process such as reactive ion etching (RIE). A person of ordinary skill in the art will recognize that the type of plasma used will depend on the material of which hard mask layer 140 is composed, and that other dry etch processes such as laser ablation, etc., may be used.

Once the desired portions of flowable oxide layer 150 and hard mask layer 140 are removed, the portion of PC layer 130 present below the removed portions of hard mask layer 140 and flowable oxide layer 150 is removed using, for example, RIE. A person of ordinary skill in the art will recognize that the type of plasma used will depend on the material of which PC layer 130 is composed, and that other dry etch processes such as laser ablation, etc., may be used. It should be appreciated that the process of defining the desired portion of PC layer 130 to be removed is accomplished using either a patterned layer of photoresist deposited above flowable oxide layer 150 or the previously etched portion of flowable oxide layer 150. As a result of etching the portions of flowable oxide layer 150, hard mask layer 140, and PC layer 130 present in PC gap region 160, the top surface of buried oxide layer 110 is exposed, and the middle PC line has been divided into two separate PC lines electrically isolated from each other, in accordance with the first depicted embodiment of the invention.

Figure 4A:
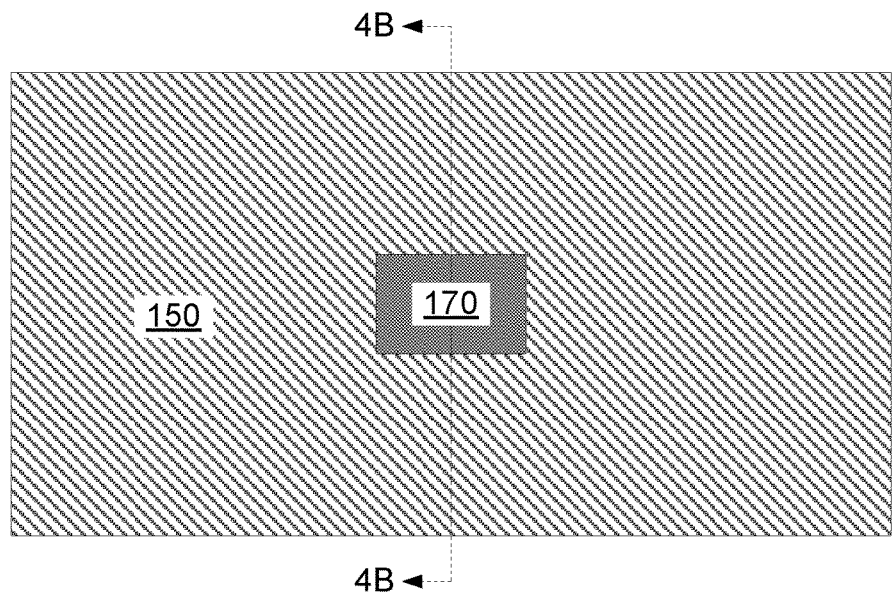
FIG. 4A depicts a top view of deposition and planarization of a PC gap insulator formed in the PC gap region of FIG. 3A, in accordance with the first embodiment of the invention.
Figure 4B:
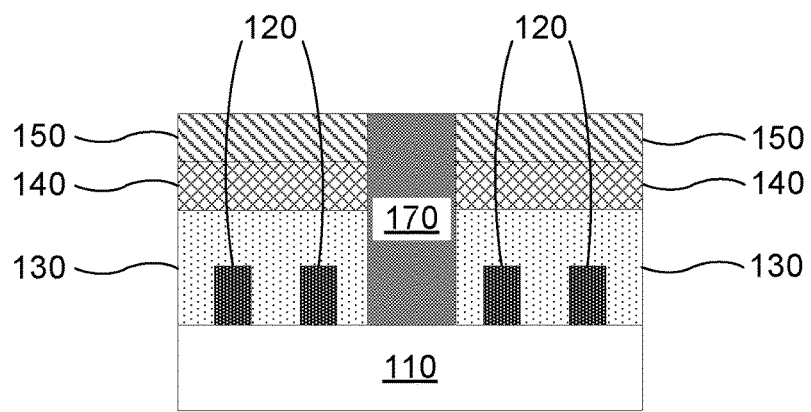
FIG. 4B depicts a section view of deposition and planarization of a PC gap insulator formed in the PC gap region of FIG. 3A, in accordance with the first embodiment of the invention.

FIGS. 4A and 4B depict a top and section view of deposition and planarization of PC gap insulator 170, in accordance with the first depicted embodiment of the invention. PC gap insulator 170 is used to electrically insulate the top portion of the middle PC line from the bottom portion of the middle PC line, in accordance with the first depicted embodiment of the invention. Additionally, PC gap insulator 170 is used to prevent the epitaxial growth of semiconductor material on the exposed surfaces of PC layer 130 (the border between PC gap region 160 and PC layer 130), herein referred to as the innermost portions of the middle PC line when the source and drain regions of the finFET device are grown in later steps not shown in the depicted embodiment of the invention. PC gap insulator 170 is composed of, for example, silicon nitride (SiN) deposited using a process such as LPCVD. It will be appreciated by one skilled in the art that the process of filling PC gap region 160 with insulating material to form PC gap insulator 170 includes depositing a blanked layer of SiN over buried oxide layer 110 and flowable oxide layer 150 then using a process such as CMP to planarize the top of PC gap insulator 170 stopping on the top surface of flowable oxide layer 150.

In various embodiments where the size and density of components is important, reducing the size of PC gaps such as PC gap region 160 allows for finFET devices to be formed more densely in a given device. Traditionally, when the source and drain terminals of the finFET device are epitaxially grown, unwanted growth of semiconductor material occurs on the inner portions of PC lines such as PC layer 130. In embodiments where the PC gap is extremely small, this growth of semiconductor material can lead to an electrical connection between two PC lines which are meant to be electrically isolated. Embodiments of the invention propose a solution to this problem by filling the regions between separated PC lines with an insulative material such as PC gap insulator 170. By filling PC gap region 160 with an electrically insulative material, direct conduction between the two segments of the PC line (the top and bottom portion of the middle PC line) is prevented, and it is not possible for any semiconductor material to form on the inner portions of PC layer 130 when the source and drain terminals of the device are grown.

Figure 5A:
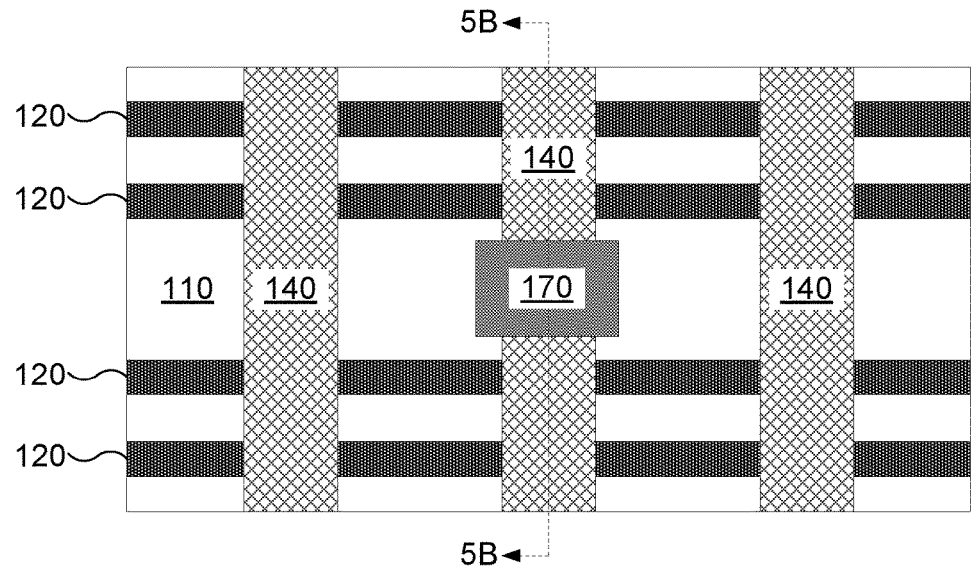
FIG. 5A depicts a top view of removal of the flowable oxide layer of FIG. 2A, in accordance with the first embodiment of the invention.
Figure 5B:
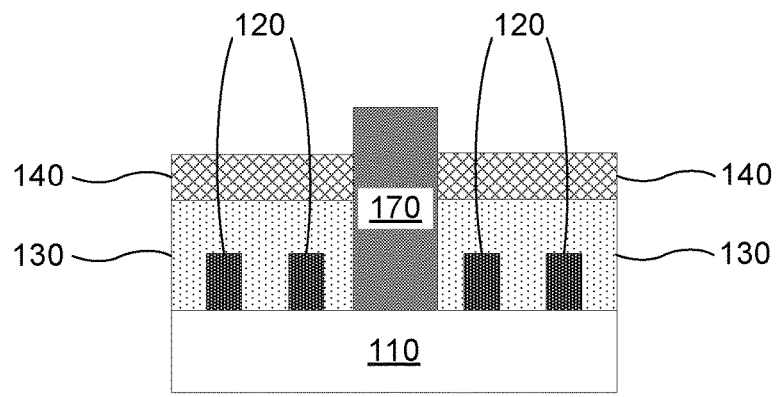
FIG. 5B depicts a section view of removal of the flowable oxide layer of FIG. 2A, in accordance with the first embodiment of the invention.

FIGS. 5A and 5B depict a top and section view of the removal of flowable oxide layer 150, in accordance with the first depicted embodiment of the invention. Flowable oxide layer 150 is removed using, for example, a wet chemical etch such as a hydrogen fluoride dip. In general, any process which can selectively remove the material of which flowable oxide layer 150 is formed (in this embodiment, silicon nitride (SiN)) without removing a significant portion of any other part of the finFET device can be used. It should be appreciated that due to the depicted embodiment requiring that the entirety of flowable oxide layer 150 be removed, no photoresist layer or hard mask layer is required for the etch process. In other embodiments where other components or materials, which would be harmed by the etch process being used, are present on the same substrate, other components or devices may be protected with a hard mask layer to ensure that they are not removed or damaged in the process of removing flowable oxide layer 150.

FIGS. 6A-11B illustrate a second depicted embodiment of the invention where a PC gap insulator similar to PC gap insulator 170 of the first depicted embodiment is formed. In the second depicted embodiment, the PC gap insulator is formed before the PC lines of the finFET device are created.

Figure 6A:
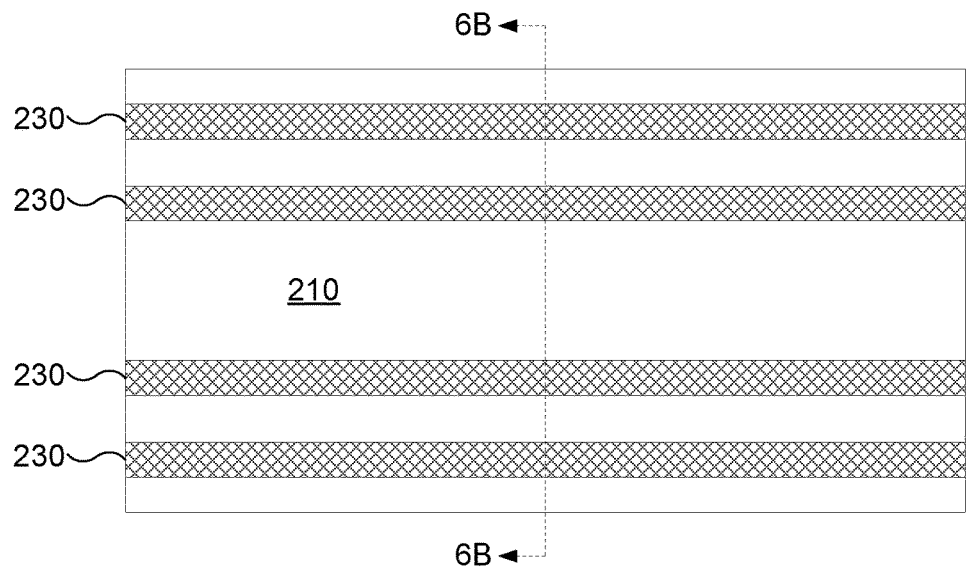
FIG. 6A depicts a top view of a buried oxide layer, fin, and hard mask layer on which the invention may be implemented, in accordance with a second embodiment of the invention.
Figure 6B:
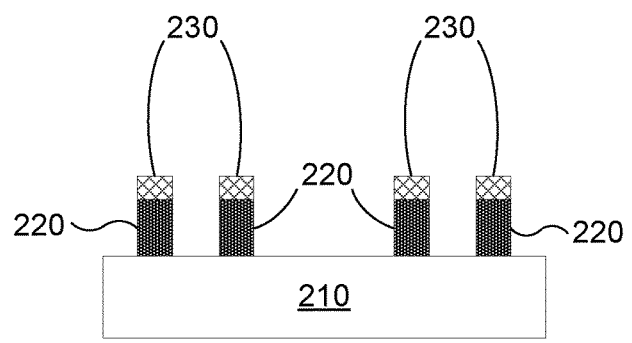
FIG. 6B depicts a section view of a buried oxide layer, fin, and hard mask layer on which the invention may be implemented, in accordance with the second embodiment of the invention.

FIGS. 6A and 6B depict a top and section view of the buried oxide layer and fins of a finFET transistor on which embodiments of the present invention may be implemented, in accordance with the second depicted embodiment of the invention. FIGS. 6A and 6B include bottom barrier 210, fin 220, and hard mask layer 230. It should be appreciated that the PC lines have not yet been formed in the embodiment depicted in FIGS. 6A and 6B and that hard mask layer 230 is present above fin 220. In general, buried oxide layer 210 acts as an electrical insulator on which the current finFET device is constructed. While the depicted embodiment includes an illustration of silicon on insulator (SOI) construction, it should be appreciated by one skilled in the art that the invention is not limited to SOI construction and that other types of semiconductor construction can be used in various embodiments of the invention, for example, bulk silicon construction. In embodiments where bulk silicon construction is used, buried oxide layer 210 may not be present in the starting wafer on which the current finFET device is constructed, and a semiconductor substrate or a shallow trench isolation (STI) filled semiconductor substrate may be present in its place. Fin 220 acts as the channel layer of the current finFET device, in accordance with various embodiments of the invention. Although the depicted embodiment includes four fins or channels present on buried oxide layer 210, any number of fins may be present in various embodiments of the invention.

Similar to the first depicted embodiment, in the second depicted embodiment, the current finFET device being created is an n-type finFET device including a p-type fin and n-type contacts for source and drain. In such embodiments, fin 220 is composed of silicon doped with p-type dopants such as boron. Fin 220 is deposited using, for example, low pressure chemical vapor deposition (LPCVD). In other embodiments, the current finFET device is a p-type FET including an n-type fin and p-type contacts for source and drain. In such embodiments, fin 220 is composed of silicon doped with n-type dopants such as phosphorus. Various embodiments of the invention can include multiple n-type finFET devices and multiple p-type finFET devices operating in conjunction to perform a specific function. Other materials of which fin 220 may be formed include, but are not limited to, germanium or silicon-germanium alloys. In a preferred embodiment, fin 220 is between 5 nm and 50 nm thick and is preferably about 20 nm thick. In various embodiments, the outermost surface of fin 220 is covered with a thin oxide layer composed of, for example, $SiO_2$ between 1 and 2 nm thick to prevent direct conductivity between fin 220 and the gate terminal of the finFET device.

In the depicted embodiment, hard mask layer 230 is present above fin 220. Hard mask layer 230 is a layer used to define the desired shape of fin 220 during formation and to protect fin 220 during subsequent fabrication steps. In various embodiments, hard mask layer 230 is composed of, for example, a dielectric material such as silicon nitride (SiN), silicon dioxide ($SiO_2$), or a combination of SiN and $SiO_2$.

Figure 7A:
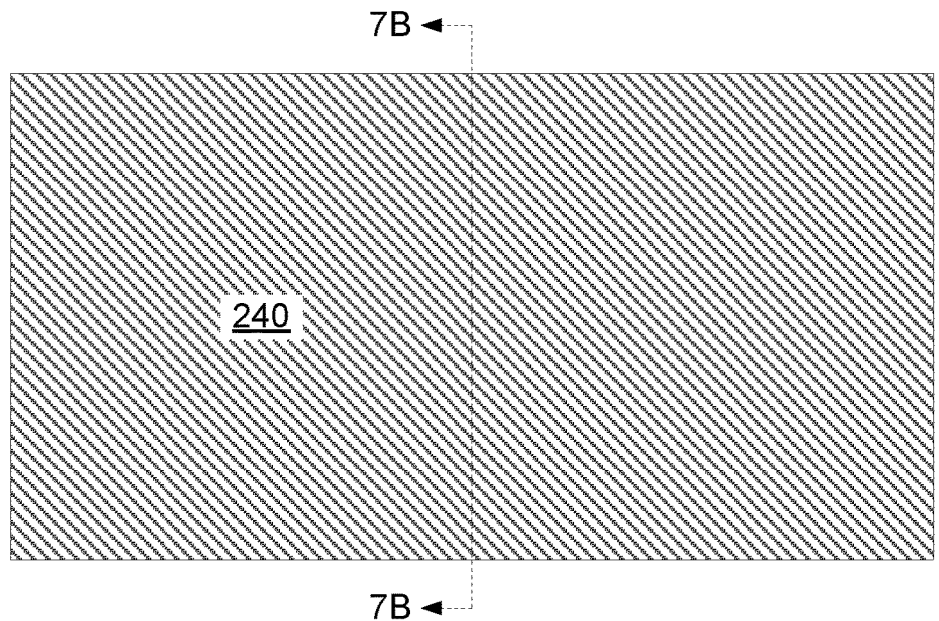
FIG. 7A depicts a top view of deposition and planarization of a flowable oxide layer deposited on the buried oxide layer and fin of FIG. 6A, in accordance with the second embodiment of the invention.
Figure 7B:
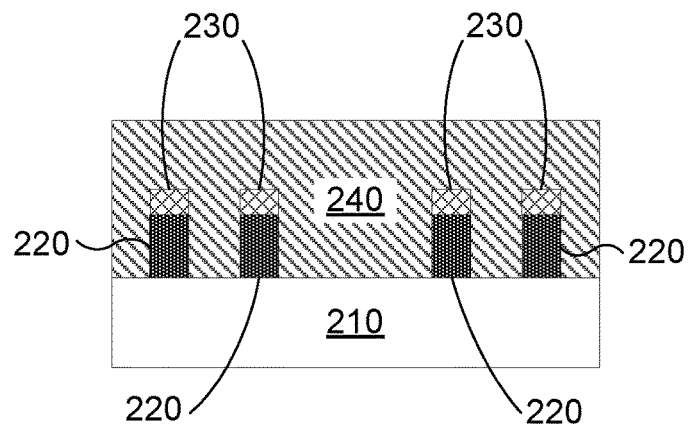
FIG. 7B depicts a section view of deposition and planarization of a flowable oxide layer deposited on the buried oxide layer and fin of FIG. 6A, in accordance with the second embodiment of the invention.

FIGS. 7A and 7B depict a top and section view of deposition and planarization of flowable oxide layer 240, in accordance with the second depicted embodiment of the invention. Flowable oxide layer 240 is used to isolate the PC gap region which is to be filled with a PC gap insulator so that other sections of the device are not harmed in the formation of the PC gap insulator. In various embodiments, flowable oxide layer 240 is composed of silicon dioxide ($SiO_2$), deposited using, for example, low pressure chemical vapor deposition (LPCVD). In general, flowable oxide layer 240 extends upwards from the top surface of buried oxide layer 210 to above the top of hard mask layer 230. In various embodiments, the depicted form of flowable oxide layer 240 is created by depositing flowable oxide layer 240 above the desired height then utilizing a planarization process such as chemical mechanical planarization (CMP) to reduce the height of flowable oxide layer 240 to the desired height. This method of forming flowable oxide layer 240 is advantageous in the depicted embodiment because it allows for the correct height of flowable oxide layer 240 to be formed evenly when the topology on which flowable oxide layer 240 is deposited is irregular such as the topology on which flowable oxide layer 240 is deposited as depicted in FIGS. 6A and 6B.

Figure 8A:
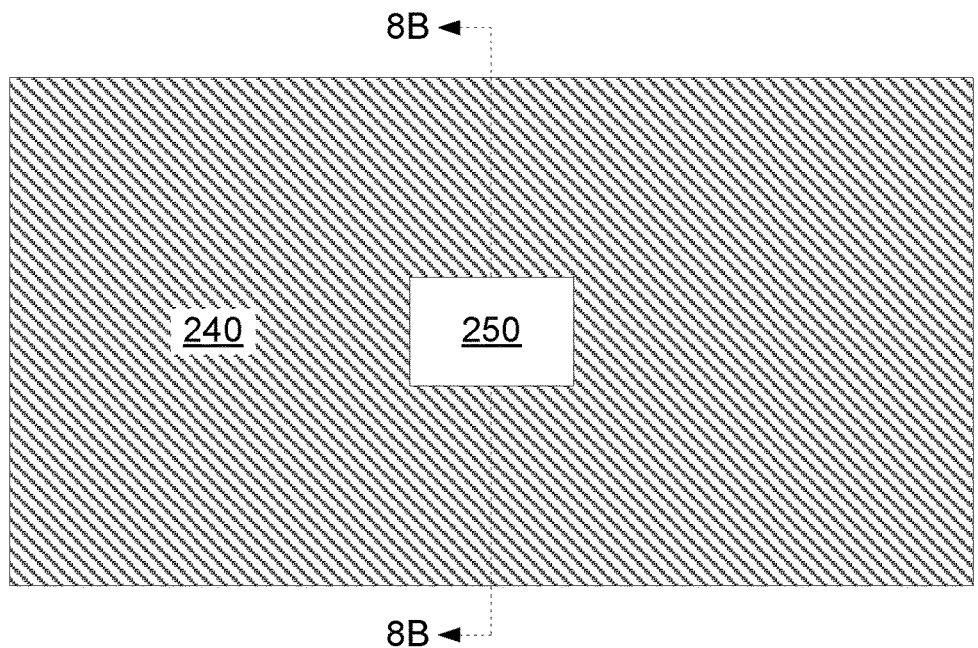
FIG. 8A depicts a top view of etching a portion of the flowable oxide layer of FIG. 7A to form a PC gap region, in accordance with the second embodiment of the invention.
Figure 8B:
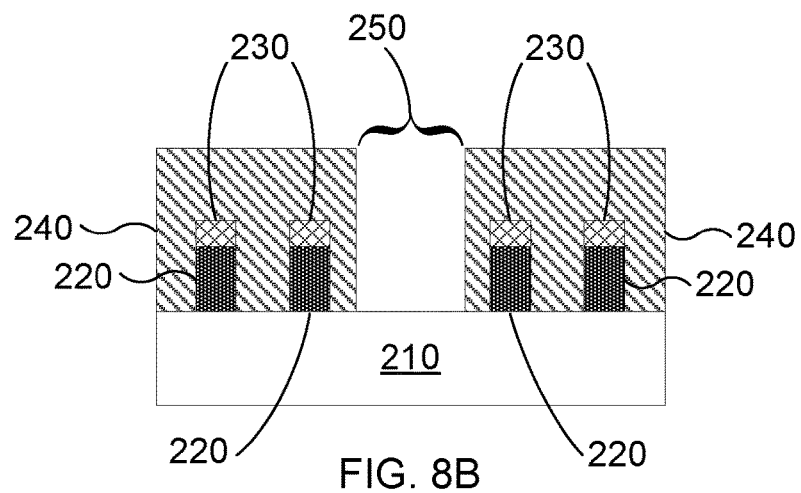
FIG. 8B depicts a section view of etching a portion of the flowable oxide layer of FIG. 7A to form a PC gap region, in accordance with the second embodiment of the invention.

FIGS. 8A and 8B depict a top and section view of formation of PC gap region 250, in accordance with the second depicted embodiment of the invention. PC gap region 250 is the region which will divide two portions of a PC line which is formed in later steps. The presence of a PC gap region such as PC gap region 250 allows the top and bottom portions of a PC line to function as two independently controlled gate terminals of the current finFET device. In the second depicted embodiment, PC gap region 250 is intended to split a middle PC line into two separate PC lines referred to as a top PC line and a bottom PC line, in accordance with the second depicted embodiment of the invention. The process of patterning the areas of flowable oxide layer 240 to be removed in the formation of PC gap region 250 involves the use of standard photolithographic processes to define the desired shape of PC gap region 250 in a layer of photoresist (not shown) deposited on the top surface of flowable oxide layer 240. In various embodiments, standard photolithographic processes are used to remove a portion of the photoresist layer corresponding to the area of flowable oxide layer 240 which is to be removed in the formation of PC gap region 250. In the depicted embodiment, the portion of flowable oxide layer 240 is removed using, for example, a dry etch process such as reactive ion etching (RIE) to remove the desired portion of flowable oxide layer 240. As a result of etching the portion of flowable oxide layer 240 present in PC gap region 250, the top surface of buried oxide layer 210 is exposed on which a PC gap insulator can be formed.

Figure 9A:
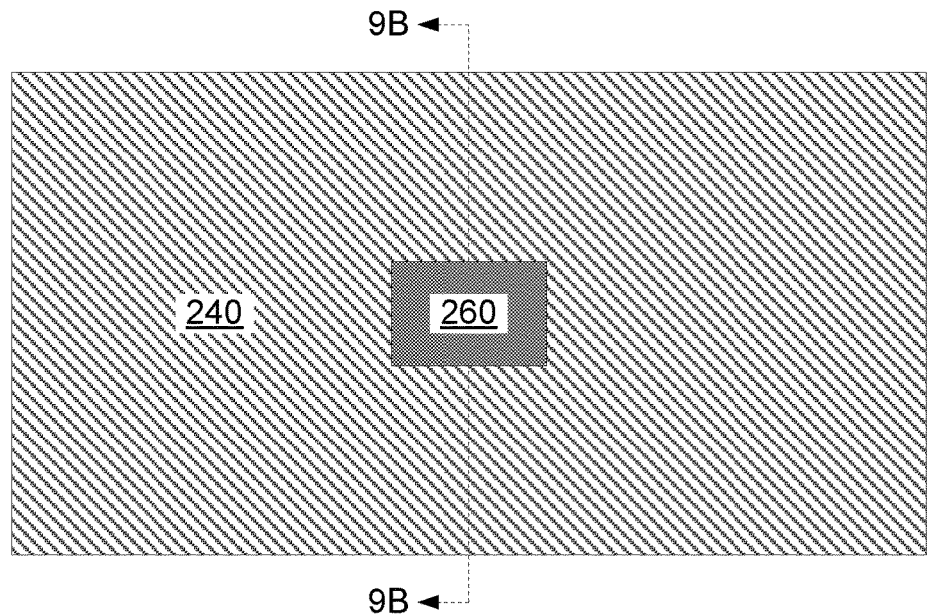
FIG. 9A depicts a top view of deposition and planarization of a PC gap insulator formed in the PC gap region of FIG. 8A, in accordance with the second embodiment of the invention.
Figure 9B:
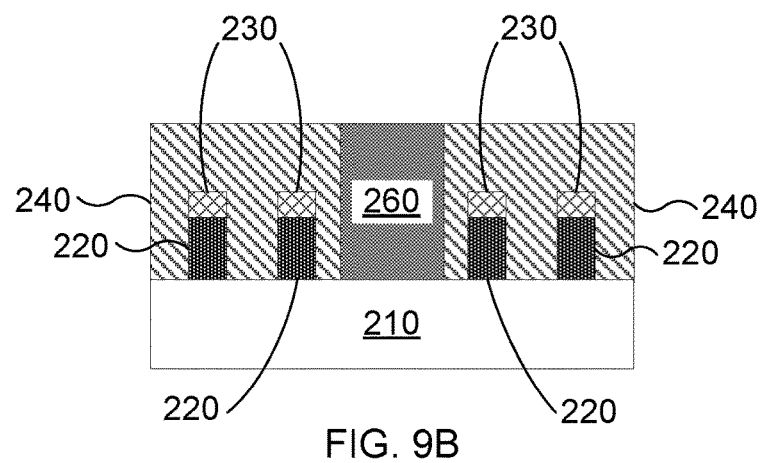
FIG. 9B depicts a section view of deposition and planarization of a PC gap insulator formed in the PC gap region of FIG. 8A, in accordance with the second embodiment of the invention.

FIGS. 9A and 9B depict a top and section view of deposition and planarization of PC gap insulator 260, in accordance with the second depicted embodiment of the invention. PC gap insulator 260 is used to electrically insulate the top portion of the middle PC line from the bottom portion of the middle PC line, in accordance with the second depicted embodiment of the invention. Additionally, PC gap insulator 260 is used to prevent the epitaxial growth of semiconductor material on the innermost surfaces of the PC layer formed in later steps (the border between PC gap region 250 and the PC layer 270) when the source and drain regions of the finFET device are epitaxially grown in later steps not shown in the depicted embodiment. PC gap insulator 260 is composed of, for example, silicon nitride (SiN) deposited using a process such as LPCVD. It will be appreciated by one skilled in the art that the process of filling PC gap region 250 includes depositing a blanked layer of SiN over buried oxide layer 210 and flowable oxide layer 240 then using a process such as CMP to planarize the top of PC gap insulator 260 stopping on the top surface of flowable oxide layer 240.

Figure 10A:
FIG. 10A depicts a top view of removal of the flowable oxide layer of FIG. 7A, in accordance with the second embodiment of the invention.
Figure 10B:
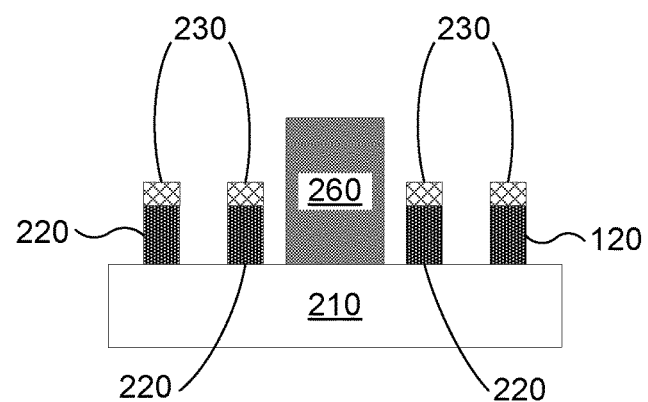
FIG. 10B depicts a section view of removal of the flowable oxide layer of FIG. 7A, in accordance with the second embodiment of the invention.

FIGS. 10A and 10B depict a top view and section view of the removal of flowable oxide layer 240, in accordance with the second depicted embodiment of the invention. Flowable oxide layer 240 is removed using, for example, a wet chemical etch such as a hydrogen fluoride dip. In general, any process which can selectively remove the material of which flowable oxide layer 240 is formed (in this embodiment, SiN) without removing a significant portion of any other part of the finFET device can be used. It should be appreciated that due to this embodiment requiring that the entirety of flowable oxide layer 240 be removed, no photoresist layer or hard mask layer is required for the etch process. In other embodiments where other components or materials which would be harmed by the etch process being used are present on the same substrate, other components or devices may be protected with a hard mask layer to ensure that they are not damaged by the process used to remove flowable oxide layer 240.

Figure 11A:
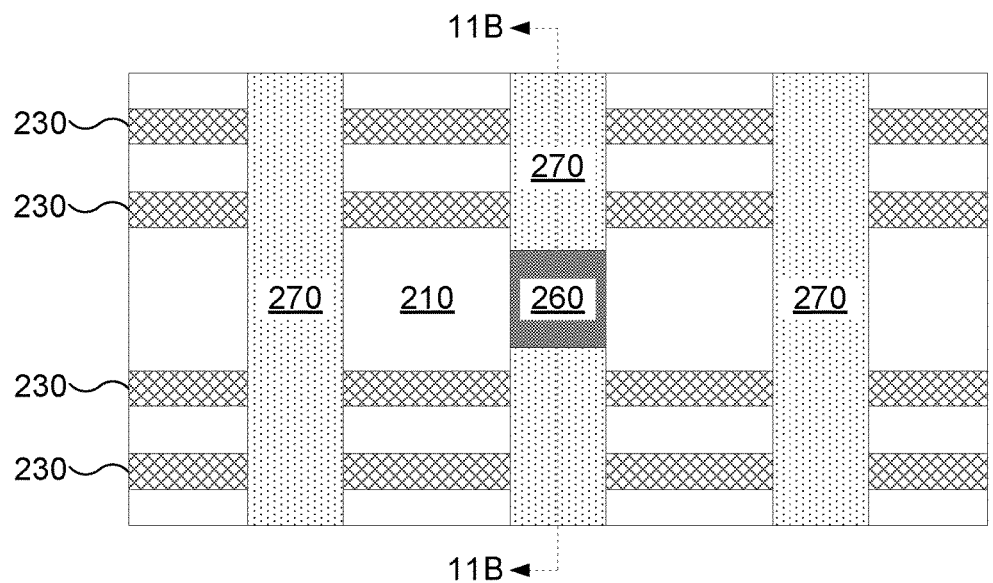
FIG. 11A depicts a top view of the deposition and etching of a PC layer on the buried oxide layer and hard mask layer of FIG. 6A, in accordance with the second embodiment of the invention.
Figure 11B:
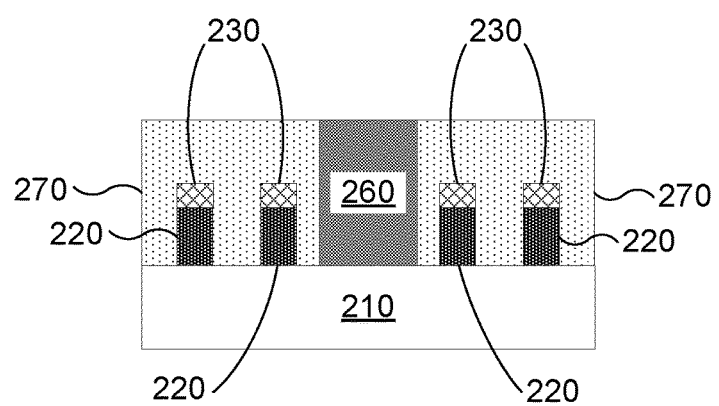
FIG. 11B depicts a section view of the deposition and etching of a PC layer on the buried oxide layer and hard mask layer of FIG. 6A, in accordance with the second embodiment of the invention.

FIGS. 11A and 11B depict a top view and section view of the formation of polysilicon (PC) layer 270, in accordance with the second depicted embodiment of the invention. In various embodiments, PC layer 270 acts as a dummy gate terminal of the present finFET device. PC layer 270 is composed of, for example, amorphous silicon, deposited using metal organic chemical vapor deposition (MOCVD). In general, PC layer 270 serves as a temporary placeholder for the gate terminal of the finFET device, and the material of which PC layer 270 is formed is later replaced with a gate dielectric stack such as hafnium oxide ($HfO_2$) and a metal gate stack such as aluminum, tungsten, or titanium in the proceeding fabrication steps not described in this embodiment. In the depicted embodiment, three PC lines (PC layer 270) are present in the depicted finFET device. However, in other embodiments, any number of PC lines may be present. In some embodiments, it is desirable to control an entire PC line using a single power source and control mechanism. In other embodiments, it is desirable to control discrete portions of a given PC line independently. Similarly to the first depicted embodiment, in the second depicted embodiment, it is desirable to be able to control the top portion and bottom portion of the middle PC line independently. The top portion of the middle PC line is defined as the portion passing over the two top-most fins in the depicted embodiment, while the bottom portion of the middle PC line is defined as the portion passing over the two bottom-most fins. In order to control the top portion and bottom portion of the middle PC line independently, a portion of the PC line dividing the top and bottom portion of the middle PC line must be removed and replaced with an insulative material which prevents conduction between the top and bottom portions of the middle PC line. In the second depicted embodiment, PC gap region 250 has already been filled with an insulative material by the time that PC layer 270 is formed.

In embodiments such as the second depicted embodiment where PC gap insulator 260 is formed before PC layer 270 is formed, PC gap insulator 260 may be initially formed wider than the desired width of PC layer 270. In these embodiments, the process of forming PC layer 270 includes an additional etching step which removes a portion of the sides of PC gap insulator 260. The removal of a portion of the side of PC gap insulator 260 ensures that none of the material of which PC layer 270 is formed will be present in the region between the top and bottom portions of the middle PC line. In some embodiments, small traces of the material of which PC layer 270 is formed will be present on the sides of PC gap insulator 260, and the removal of a portion of the sides of PC gap insulator 260 is intended to remove any additional portions of material which may lead to an electrical connection between the top and bottom portions of the middle PC line.

What is claimed is:

1. A method of fabricating localized isolation between a first gate terminal and a second gate terminal, the method comprising:
    providing a semiconductor device, the semiconductor device comprising:
        a substrate;
        two or more semiconductor fins formed on the substrate; and
        one or more gates formed on the two or more semiconductor fins and the substrate;
    depositing a flowable oxide layer on the semiconductor device;
    etching an area between the two or more semiconductor fins such that the substrate is exposed;
    depositing an insulating layer within the etched area; and
    removing at least the flowable oxide layer.

2. The method of claim 1, wherein the semiconductor device further comprises:
    a hard mask layer present on each of the two or more semiconductor fins.

3. The method of claim 1, wherein the semiconductor device further comprises:
    a hard mask layer present on each of the one or more gates.

4. The method of claim 1, further comprising:
    removing a portion of the insulating layer present above the top of the flowable oxide layer.

5. The method of claim 1, wherein the insulating layer is comprised of silicon nitride.

6. The method of claim 1, wherein the first gate and the second gate are each comprised of polysilicon.

7. The method of claim 1, wherein the semiconductor device further comprises:
    An oxide layer formed on each of the two or more semiconductor fins.

8. A method of fabricating localized isolation between a first gate terminal and a second gate terminal, the method comprising:
    providing a semiconductor device, the semiconductor device comprising:
        a substrate; and
        two or more semiconductor fins formed on the substrate;
    depositing a flowable oxide layer on the semiconductor device;
    etching an area between the two or more semiconductor fins such that the substrate is exposed;

depositing an insulating layer within the etched area;
removing at least the flowable oxide layer;
forming a first gate over at least a first semiconductor fin of the two or more semiconductor fins; and
forming a second gate over at least a second semiconductor fin of the two or more semiconductor fins.

9. The method of claim 8, wherein the semiconductor device further comprises:
a hard mask layer present on each of the two or more semiconductor fins.

10. The method of claim 8, further comprising:
forming a hard mask layer on the first gate and the second gate.

11. The method of claim 8, wherein the insulating layer is comprised of silicon nitride.

12. The method of claim 8, wherein the first gate and the second gate are each comprised of polysilicon.

13. The method of claim 8, wherein the distance between the first gate and the second gate is less than or equal to ten nanometers.

* * * * *